United States Patent [19]
Wollesen

[11] Patent Number: 5,659,201
[45] Date of Patent: Aug. 19, 1997

[54] HIGH CONDUCTIVITY INTERCONNECTION LINE

[75] Inventor: Donald L. Wollesen, Saratoga, Calif.

[73] Assignee: Advanced Micro Devices, Inc., Sunnyvale, Calif.

[21] Appl. No.: 463,805

[22] Filed: Jun. 5, 1995

[51] Int. Cl.$^6$ .................................... H01L 23/48
[52] U.S. Cl. ............... 257/758; 257/741; 257/750; 257/751; 257/762; 257/784
[58] Field of Search ...................... 257/758, 774, 257/771, 784, 762, 750, 767, 741, 765, 659

[56] References Cited

U.S. PATENT DOCUMENTS

| | | | |
|---|---|---|---|
| 4,931,410 | 6/1990 | Tokunaga et al. | 437/189 |
| 5,060,050 | 10/1991 | Tsuneoka et al. | 257/762 |
| 5,235,212 | 8/1993 | Shimizu et al. | 257/784 |

FOREIGN PATENT DOCUMENTS

| | | | |
|---|---|---|---|
| 52-58491 | 5/1977 | Japan | 257/784 |
| 56-116642 | 9/1981 | Japan | 257/784 |
| 60-178646 | 9/1985 | Japan | 257/659 |
| 60-261169 | 12/1985 | Japan | 257/659 |
| 63-107045 | 5/1988 | Japan | 257/784 |
| 4120726 | 4/1992 | Japan . | |
| 4150034 | 5/1992 | Japan . | |

OTHER PUBLICATIONS

"New Interconnect Materials: Chasing the Promise of Faster Chips," P. Singer, Semiconductor International, Nov. 1994, pp. 52–56.

"Passivation Schemes for Copper/Polymer Thin–Film Interconnections Used in Multichip Modules," G.M. Adema, et al., IEEE Transactions on Components, Hybrids, and Manufacturing Technology, vol. 16, No. 1, Feb. 1993, pp. 53–59.

*Primary Examiner*—Mahshid D. Saadat
*Assistant Examiner*—T. M. Arroyo
*Attorney, Agent, or Firm*—Lowe, Price, LeBlanc & Becker

[57] ABSTRACT

High conductivity interconnection lines are formed of high conductivity material, such as copper, employing barrier layers impervious to the diffusion of copper atoms. Higher operating speeds are obtained with conductive interconnection lines, preferably copper interconnection lines, formed above the wire bonding layer.

26 Claims, 8 Drawing Sheets

HIGH CONDUCTIVITY INTERCONNECTION LINE

TECHNICAL FIELD

The present invention relates to a semiconductor device comprising a high conductivity interconnection line, and to a method of manufacturing the semiconductor device. The present invention also relates to high speed integrated circuits.

BACKGROUND ART

Conventional semiconductor devices typically comprise a semiconductor substrate, normally made of monocrystalline silicon, and a plurality of dielectric and conductive layers formed thereon. An integrated circuit is formed containing a plurality of conductive patterns comprising conductive lines separated by interwiring spacings, and a plurality of interconnect lines, such as bus lines, bit lines, word lines and logic interconnect lines. Such interconnection lines generally constitute a limiting factor in terms of various functional characteristics of the integrated circuit. There exists a need to provide a reliable interconnection structure capable of achieving higher operating speeds, improved signal-to-noise ratio, improved wear characteristics and improved reliability.

Most interconnection lines are made of aluminum or an aluminum-base alloy. The performance of a semiconductor device could be improved by forming the interconnection line of a metal having a higher conductivity than aluminum, thereby increasing current handling capability. It is known that copper, copper-base alloys, gold, gold-base alloys, silver and silver-base alloys generally exhibit a higher conductivity than aluminum and aluminum-base alloys. However, those having ordinary skill in the art have shunned the use of copper for forming an interconnection line, because copper readily diffuses through silicon dioxide, the typical dielectric material employed in the manufacture of semiconductor devices, and adversely affects active silicon devices. Moreover, a low cost satisfactory method for joining a bonding pad to copper for external connection has yet to be developed.

According to conventional practices, a plurality of conductive layers are formed above a semiconductor substrate, and the uppermost conductive layer joined to a bonding pad for forming an external electrical connection. The uppermost conductive layer which is connected externally is typically referred to as the wire bonding layer. A "scratch protection" (topside) dielectric layer is normally formed on the wire bonding layer, to prevent contamination of the semiconductor device during assembly and provide resistance to moisture, sodium, etc.

In the conventional semiconductor device illustrated in FIG. 1, p-type semiconductor substrate 1 is provided with field oxide 2 for isolating an active region comprising N+ source/drain regions 3, and a gate electrode 4, typically of polysilicon, above the semiconductor substrate with gate oxide 5 therebetween. Interlayer dielectric layer 6, typically silicon dioxide, is then deposited thereover and openings formed by conventional photolithographic and etching techniques for establishing electrical contact between subsequently deposited conductive layer 8, typically of aluminum or an aluminum-base alloy, and source/drain regions 3 through vias 7, and to transistor gate 4a. Dielectric layer 9, typically silicon dioxide, is deposited on conductive layer 8, and another conductive layer 10, typically aluminum or an aluminum-base alloy, formed on dielectric layer 9 and electrically connected to conductive layer 8 through vias 11.

With continued reference to FIG. 1, conductive layer 10 is the uppermost conductive layer and, hence, constitutes the wire bonding layer. Dielectric layer 12, also typically silicon dioxide, is deposited, and a protective dielectric scratch resistant ("topcoat") layer 13 deposited thereon. Protective dielectric layer 13 typically comprises silicon nitride ($Si_3N_4$) or a silicon oxynitride ($SiOxNy$), and basically provides scratch protection to the semiconductor device and protection against moisture and impurity contamination during subsequent processing. After deposition of the protective dielectric layer 13, conventional photolithographic and etching techniques are employed to form an opening to expose wire bonding layer 10 for external connection by means of bonding pad 14 and electrically conductive wires 15 or an external connection electrode (not shown).

Although only two conductive layers 8 and 10 are illustrated in FIG. 1 for simplicity, conventional semiconductor devices are not so limited and may comprise more than two conductive layers, depending on design requirements. Also in the interest of simplicity, FIG. 1 does not illustrate any particular type of plug or barrier layer technology. However, such technology is conventional and, therefore, the details of such features are not set forth herein.

The escalating requirements of current carrying capacity, higher operating speeds, improved reliability, wear characteristics, signal-to-noise ratios, and miniaturization, require corresponding improvements in the materials and design of conventional semiconductor devices, such as that depicted in FIG. 1.

DISCLOSURE OF THE INVENTION

An object of the present invention is a highly integrated semiconductor device having an interconnection structure exhibiting high operating speeds, improved signal-to-noise ratio, wear characteristics and reliability.

Another object is a method of producing a semiconductor device having an interconnection structure with high operating speeds, improved signal-to-noise ratio, wear characteristics and reliability.

Additional objects, advantages and other features of the invention will be set forth in part in the description which follows and in part will become apparent to those having ordinary skill in the art upon examination of the following or may be learned from a practice of the invention. The objects and advantages of the invention may be realized and obtained as particularly pointed out in the appended claims.

According to the present invention, the foregoing and other objects are achieved in part by a semiconductor device comprising: a semiconductor substrate; a plurality of levels of dielectric layers and conductive layers formed on the semiconductor substrate, wherein an upper conductive layer constitutes a wire bonding layer for external connection thereto; and a conductive interconnection line formed at a level above the wire bonding layer.

Another aspect of the present invention is a semiconductor device having an integrated circuit on a die, which semiconductor device comprises: a semiconductor substrate; a dielectric layer formed thereon; and a metal interconnection line formed on the dielectric layer; wherein the metal interconnection line consists essentially of a metal selected from the group consisting of copper, copper-base alloys, gold, gold-base alloys, silver, silver-base alloys and superconducting materials.

A further aspect of the present invention is a method of manufacturing a semiconductor device, which method comprises: forming a plurality of levels of dielectric layers and conductive layers on a semiconductor substrate, wherein an upper conductive layer constitutes a wire bonding layer for external connection thereto; forming a protective dielectric layer on the wire bonding layer; forming a conductive interconnection line on the protective dielectric layer; forming an opening in the protective dielectric layer exposing a portion of the wire bonding layer; and forming an external connection to the wire bonding layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
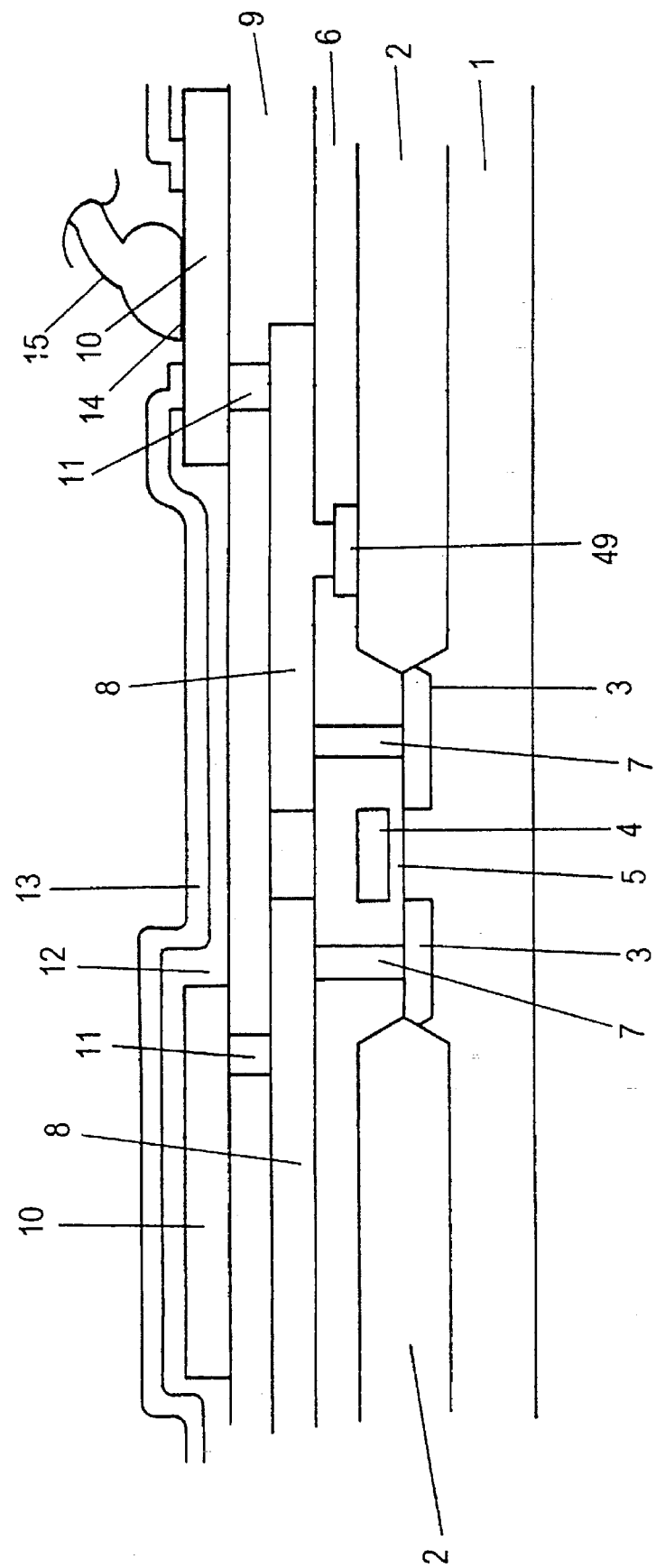
FIG. 1 schematically depicts a cross-sectional view of a conventional semiconductor device comprising a wire bonding layer.

The present invention departs from conventional semiconductor technology by, inter alia, increasing the design flexibility of semiconductor devices. The present invention enables the use of a variety of materials for conductive layers and conductive interconnection lines, and positioning of such conductive layers and conductive interconnection lines to improve reliability, achieve higher operating speeds, improve signal-to-noise ratios, improve wear characteristics and improve reliability. Conventional wisdom in the semiconductor art focused upon the use of aluminum and aluminum-base alloys for conductive layers and conductive interconnection lines, while shunning the use of materials such as copper and copper-base alloys, primarily because of the adverse effect of copper atoms on silicon devices. Copper atoms rapidly diffuse through silicon dioxide, the dielectric material of choice in fabricating semiconductor devices, and adversely affect the active silicon devices. Moreover, there is no available cost effective technique to reliably bond an external connection to a copper interconnection line.

The present invention proceeds against such conventional wisdom in at least two respects. In an embodiment of the present invention, a conductive layer is formed of a metal other than aluminum or an aluminum-base alloy. In a preferred aspect of this embodiment, a conductive layer is formed of copper or a copper-base alloy, notwithstanding the fact that copper atoms rapidly diffuse through silicon dioxide and negatively affect the performance of silicon devices. By the present invention, this negative aspect of copper is overcome by providing a barrier layer between a copper conductive layer or copper interconnection line and the active silicon devices. Such a barrier layer can be conveniently formed by employing a material which is substantially impervious to the diffusion of copper atoms therethrough. For example, a barrier layer can be formed of a dielectric material, such as silicon nitride or silicon oxynitride, which is substantially impervious to the diffusion of copper atoms therethrough. In certain situations, as when forming a via to electrically connect a copper conductive layer or copper interconnection line to a lower level conductive layer, a conductive barrier layer is provided. Such a conductive barrier layer is formed from a conductive material which is substantially impervious to the diffusion of copper atoms therethrough. Such substantially impervious material is preferably titanium nitride, titanium oxynitride or titanium-tungsten.

In another preferred aspect of this embodiment, a via is formed to electrically connect a copper interconnection line or copper conductive layer with a lower level conductive layer. In order to prevent the migration of copper atoms, a conductive barrier layer is formed between the copper interconnection line or copper conductive layer and lower conductive line. Such a barrier layer comprises a material which is substantially impervious to diffusion of copper atoms therethrough, such as titanium nitride, titanium oxynitride or titanium-tungsten. Such vias can preferably be formed by single and/or dual damascene techniques, such as those known in the art.

Damascene is an art which has been employed for centuries in the fabrication of jewelry, and has recently been adapted for application in the semiconductor industry. Damascene basically involves the formation of a trench which is filled with a metal. Thus, damascene differs from the traditional etch back methods of providing an interconnection structure by forming a pattern of openings in a dielectric layer, which openings are filled in with metal to form a conductive pattern followed by planarization vis-à-vis the traditional etch back technique of depositing a metal layer, forming a conductive pattern with interwiring spacings, and filling in the interwiring spacings with dielectric material. In copending application Ser. No. 08/320,516 filed on Oct. 11, 1994, prior art single and dual damascene techniques are disclosed, in addition to several improved dual damascene techniques for greater accuracy in forming fine line patterns with minimal interwiring spacings.

In accordance with the present invention, a conductive layer or conductive interconnection line is also formed of other highly conductive and desirable materials, such as gold, gold-base alloys, silver, silver-base alloys and known superconducting materials. In a preferred aspect of this embodiment, a metal interconnection line comprising a conductive metal other than aluminum or an aluminum-base alloy is formed at a level above the wire bonding layer. One or more layers of interconnect may be formed above the wire bonding layer.

According to conventional practices in the manufacture of semiconductor devices, an upper conductive layer, i.e., the uppermost or last level metal layer deposited, invariably constitutes the wire bonding layer for external connection, and a protective dielectric (scratch protection or top side) layer, typically silicon nitride, deposited thereon. Another embodiment of the present invention departs from such conventional practices by providing a metal interconnection line over the protective dielectric layer which is conventionally provided on the industrial standard aluminum or aluminum-base alloy wire bonding layer. In accordance with this embodiment of the present invention, an external connection is formed to the wire bonding layer via a bonding pad after forming the metal interconnect line above the wire bonding layer.

The use of a metal interconnection line above the bonding layer expands the current carrying capabilities of the semiconductor device affording greater design flexibility, enables higher operating speeds, improves the signal-to-noise ratio and enhances reliability. The conductive interconnection line advantageously comprises a conductive metal, preferably a metal selected from the group consisting of copper, copper-base alloys, refractory metals, refractory metal compounds, refractory metal alloys, silver, silver-base alloys, gold, gold-base alloys and superconducting materials. Preferably, the conductive interconnection line formed at a level above the wire bonding layer comprises copper or a copper-base alloy. Since the typical protective dielectric (scratch protection) layer formed over the wire bonding layer comprises silicon nitride, a copper or copper-base interconnection line can be applied over the wire bonding layer on the silicon nitride protective layer without significant modification of conventional fabrication set-ups. The conventional silicon nitride protective layer serves as a barrier to the diffusion of copper atoms since it is substantially impervious to the diffusion of copper atoms therethrough. The protective dielectric layer can also be formed of a silicon oxynitride material, or any other material having suitable dielectric properties and substantially impervious to the diffusion of copper atoms.

In a preferred aspect of this embodiment, a via is formed to provide electrical contact between the conductive interconnection line above the wire bonding layer and the wire bonding layer and/or other lower conductive layer. When employing copper or a copper-base interconnection line above the wire bonding layer, a conductive barrier layer is preferably provided between the copper or copper-base alloy interconnection line and the wire bonding layer and/or other lower conductive layer. Such a barrier layer can be formed of any conductive material which is substantially impervious to the diffusion of copper atoms, such as titanium nitride, titanium oxynitride or titanium-tungsten.

In another preferred aspect of this embodiment, an additional protective dielectric layer is formed on the conductive interconnection line above the wire bonding layer. In employing copper or a copper-base alloy for the conductive interconnection line above the wire bonding layer, it is preferred to form such an additional protective dielectric layer of a material which is substantially impervious to the diffusion of copper atoms therethrough, such as silicon nitride or a silicon oxynitride. An opening is then formed through the additional protective dielectric layer down to and exposing a portion of the wire bonding layer, to which a bonding pad is joined for and provided with an external electrode or wires for external connection.

In providing an opening for an external electrical connection to the wire bonding layer, conventional photolithographic and etching techniques are employed to form an opening through the additional protective dielectric layer, conductive interconnection line and underlying protective dielectric layer to expose a portion of the surface of the wire bonding layer. The bonding pad, external electrode and/or wires for external electrical connection are formed in accordance with conventional practices. Such conventional practices may include ultrasonic welding, gold ball bonding pads, and aluminum or aluminum-base alloy bonding pads.

In manufacturing a semiconductor device in accordance with the present invention, conventional photolithographic, etching and deposition techniques can be employed. In a preferred embodiment, a plurality of levels of dielectric layers and conductive layers are formed on the semiconductor substrate with the uppermost conductive layer constituting a wire bonding layer. A protective dielectric layer is formed on the wire bonding layer and a conductive interconnection line formed on the protective dielectric layer. An opening is then formed in the protective dielectric layer down to and exposing a portion of the wire bonding layer. An external conductive connection is then formed to the wire bonding layer.

In carrying out the various embodiments of the present invention, conventional metallization techniques can be employed for the deposition of conductive layers and interconnection lines, such as various types of chemical vapor deposition (CVD) processes, including low pressure chemical vapor deposition (LPCVD), and plasma enhanced chemical vapor deposition (PECVD). Normally, when high melting point metal such as tungsten are deposited, CVD techniques are employed. Low melting point metals, such as aluminum and aluminum-base alloys, may be deposited by melting or sputtering. Polysilicon can also be employed as a conductive material in the interconnection pattern. The various layers are planarized by known planarization techniques, such as etching and chemical-mechanical polishing techniques.

The various embodiments of the present invention involve the formation of openings, such as vias and trenches, employing conventional photolithographic techniques, including the use of photoresist, mask, etch recipes, and etching techniques as, for example, plasma etching and reactive ion etching. Various embodiments of the present invention may also employ an etch stop layer, such as a nitride layer, preferably silicon nitride.

The various embodiments of the present invention may comprise damascene techniques, such as single and dual damascene techniques. In dual damascene techniques, vias and trenches are simultaneously filled with conductive material conventionally employed in fabricating interconnection structures, preferably with the use of a barrier layer.

The various embodiments of the present invention involve a conventional semiconductor substrate, such as monocrystalline silicon, and conventional dielectric layers, such as oxide layers, preferably silicon dioxide layers, formed in a conventional manner as by thermal oxidation of a deposited silicon layer, PECVD, thermal enhanced CVD, spin on techniques, and silicon dioxide derived from deposited tetra ethyl ortho silicate (TEOS).

Figure 2:
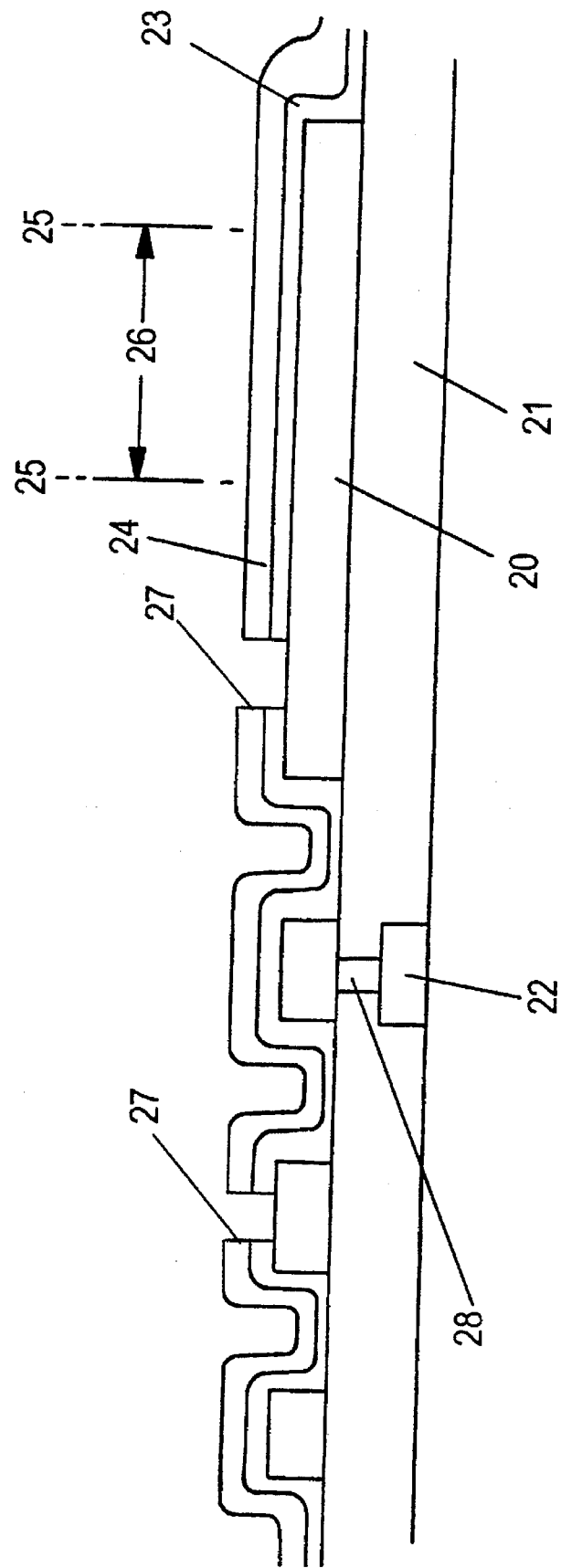
FIG. 2 depicts the formation of a conductive interconnection line in accordance with an embodiment of the present invention.

An embodiment of the present invention is shown in FIG. 2 wherein, for simplicity, the uppermost aluminum conductive layer or wire bonding layer 20, corresponding to aluminum layer 10 in FIG. 1, is shown deposited on dielectric layer 21 in electrical contact with underlying aluminum layer 22 using contact 28, without depicting the various underlayers and semiconductor substrate which are conventional. A dielectric layer 23, preferably silicon dioxide, is formed over wire bonding layer 20 and a dielectric protective layer 24, typically of silicon nitride, formed thereon. Silicon dioxide layer 23 is optional, and can be omitted. When forming a copper or copper-base alloy interconnection line above the wire bonding layer, it is preferable to form dielectric layer 24 from silicon nitride, since it serves as a barrier to the diffusion of copper atoms which can interfere with the operation of active silicon devices. Dotted lines 25 depict area 26 designed for subsequent formation of an opening or bonding pad cut through which a bonding pad will be provided for external electrical connection with bonding layer 20.

Openings 27 are provided through dielectric layers 24 and 23 exposing wire bonding layer 20, by conventional photolithographic and etching techniques. In accordance with the present invention, via plugs, such as tungsten or other conductive material, may be employed using conventional techniques. However, the formation of plugs is optional.

Figure 3:
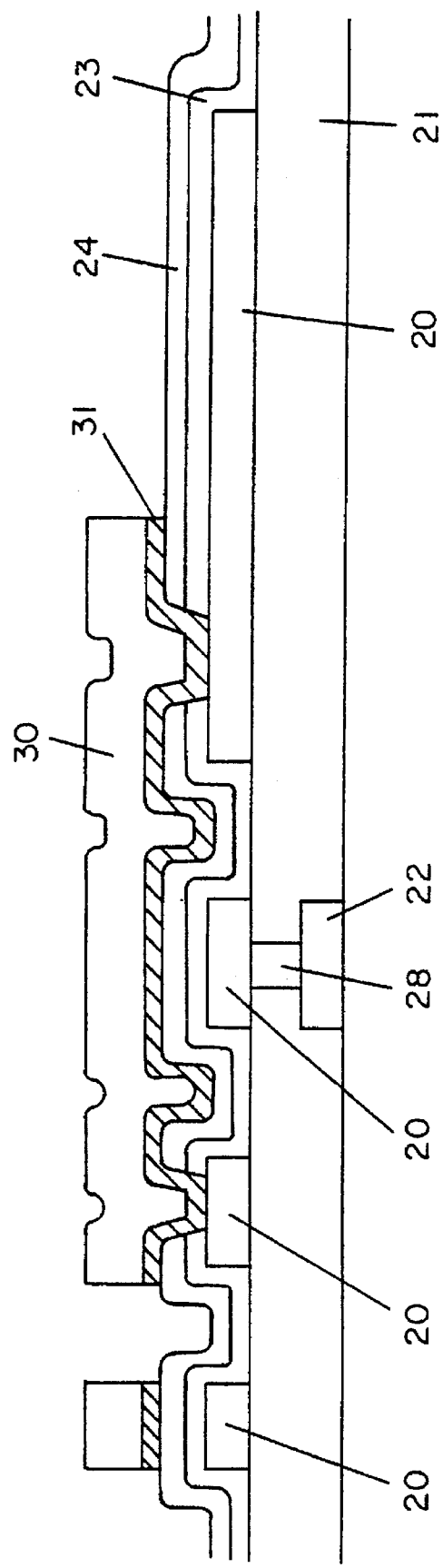
FIG. 3 schematically depicts the use of a barrier layer in accordance with another embodiment of the present invention.

As shown in FIG. 3, metal interconnection line 30 is deposited on protective dielectric layer 24 above wire bonding layer 20. In a preferred aspect of this embodiment, metal interconnection line 30 comprises copper or a copper-base alloy. Accordingly, conductive barrier layer 31 is advantageously formed comprising a material which is substantially impervious to the diffusion of copper atoms therethrough, thereby preventing contamination of underlying active regions by copper atoms. Such a conductive barrier layer can comprise titanium nitride, titanium oxynitride or titanium-tungsten, preferably titanium oxynitride. After patterning conductive interconnection line 30 and conductive barrier layer 31, an opening is formed in conductive layer 30 and conductive barrier layer 31, employing conventional photolithographic and etching techniques. For example, a wet chemical etch or a dry plasma etch can be used to pattern the conductive interconnection line 30 and conductive barrier layer 31. It is preferred to employ a dry etch to penetrate the barrier layer.

Figure 4:
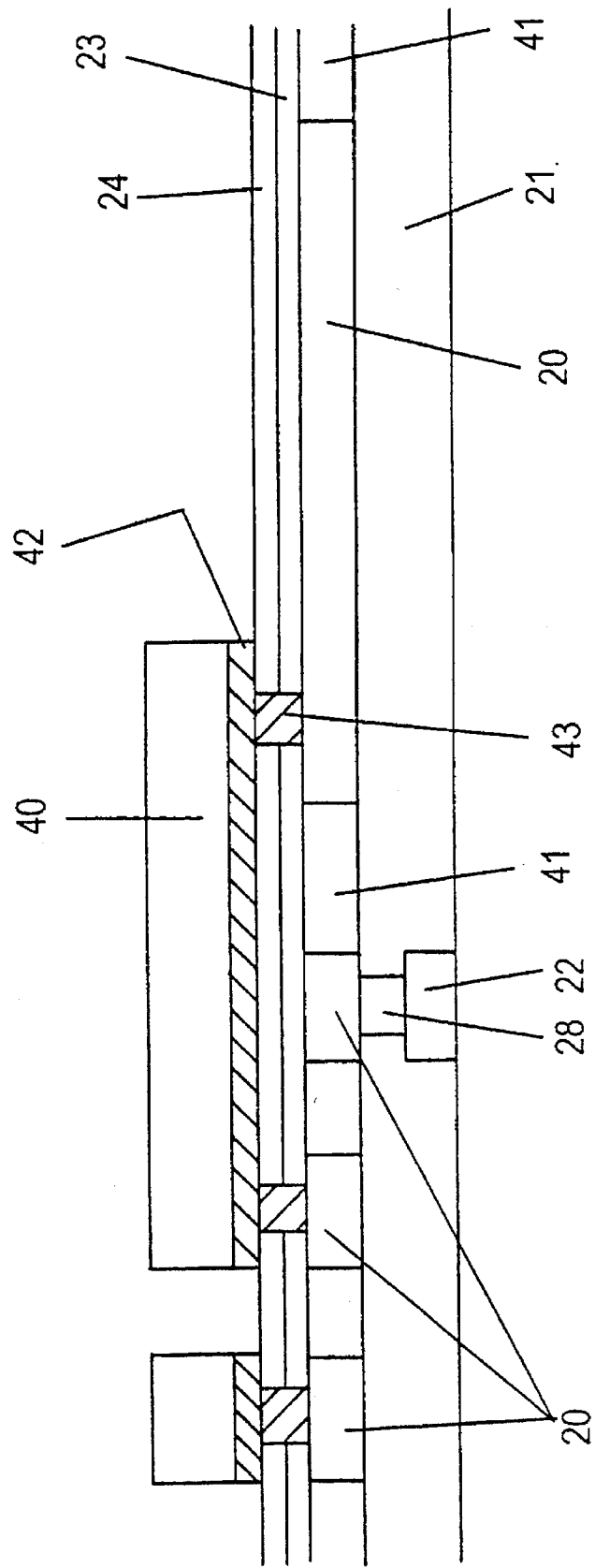
FIG. 4 depicts another embodiment of the present involving a barrier layer.

The embodiment depicted in FIG. 4 is similar to that depicted in FIG. 3, but comprises a planarized layer containing a conductive pattern defined by portions of wire bonding layer 20 and dielectric 41, and a complete conductive barrier layer 42 formed between the copper or copper-base interconnection line 40 and all layers thereunder. Typically, planarization of the layers is effected by conventional etching and/or chemical-mechanical polishing. Conductive barrier layer 42 comprises a conductive material, such as titanium oxynitride, which is substantially impervious to the diffusion of copper atoms therethrough. Conductive barrier 42 is formed directly beneath copper interconnection line 40 overlapping silicon nitride protective dielectric barrier layer 24 and, thereby, provides additional barrier protection against the diffusion of copper atoms at vias 43, which are preferably filled with tungsten or a tungsten-base alloy.

Figure 5:
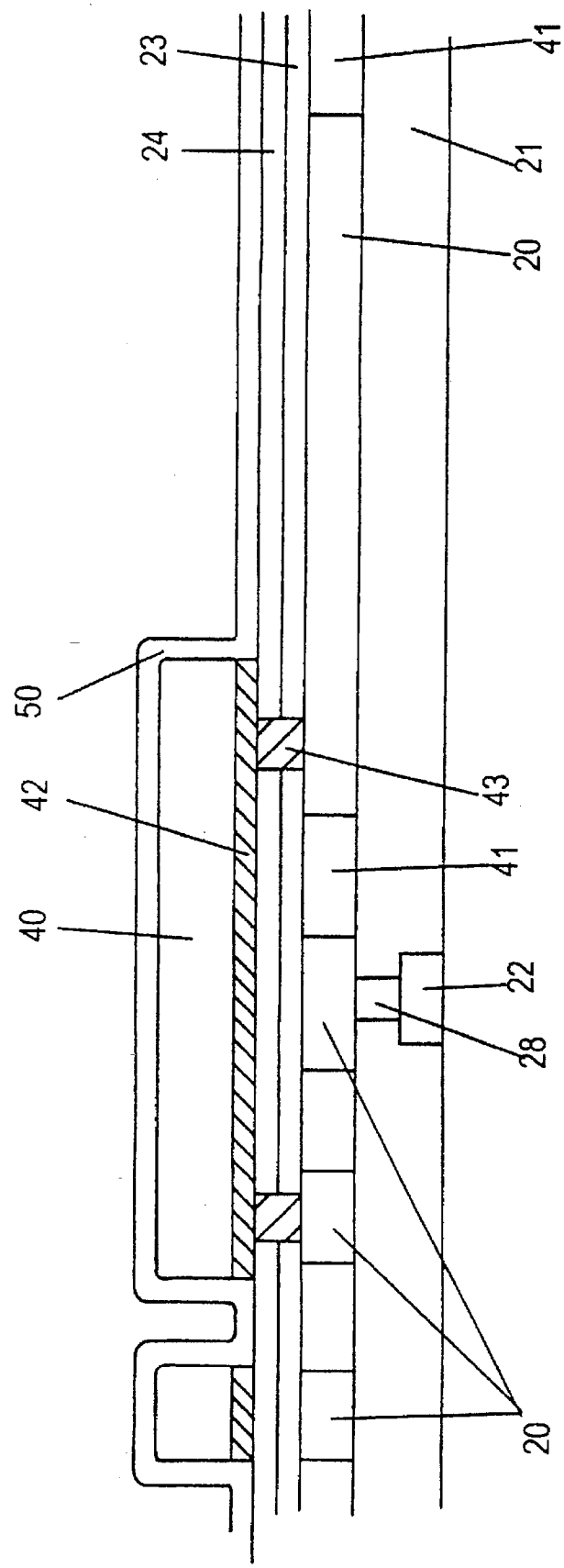
FIG. 5 depicts another embodiment of the present invention.

A preferred embodiment of the present invention is illustrated in FIG. 5, wherein an additional protective dielectric layer 50 is formed on copper or copper-base alloy interconnection line 40. Thus, FIG. 5 constitutes a further improvement of the embodiment shown in FIG. 4 by providing additional protective dielectric layer 50, preferably comprising a material which is substantially impervious to the diffusion of copper atoms therethrough, such as silicon nitride or silicon oxynitride. In another embodiment, additional protective dielectric layer 50 can comprise a composite of a layer of silicon dioxide and a layer of material which is substantially impervious to the diffusion of copper atoms therethrough, such as silicon nitride or silicon oxynitride. In this embodiment of the present invention, copper interconnect line 40 is completely encased in barrier layers comprising a material substantially impervious to the diffusion of copper atoms therethrough. Thus, a semiconductor device is provided containing a copper or copper-base interconnection line without substantial risk of contaminating the active silicon devices by copper atoms.

Figure 6:
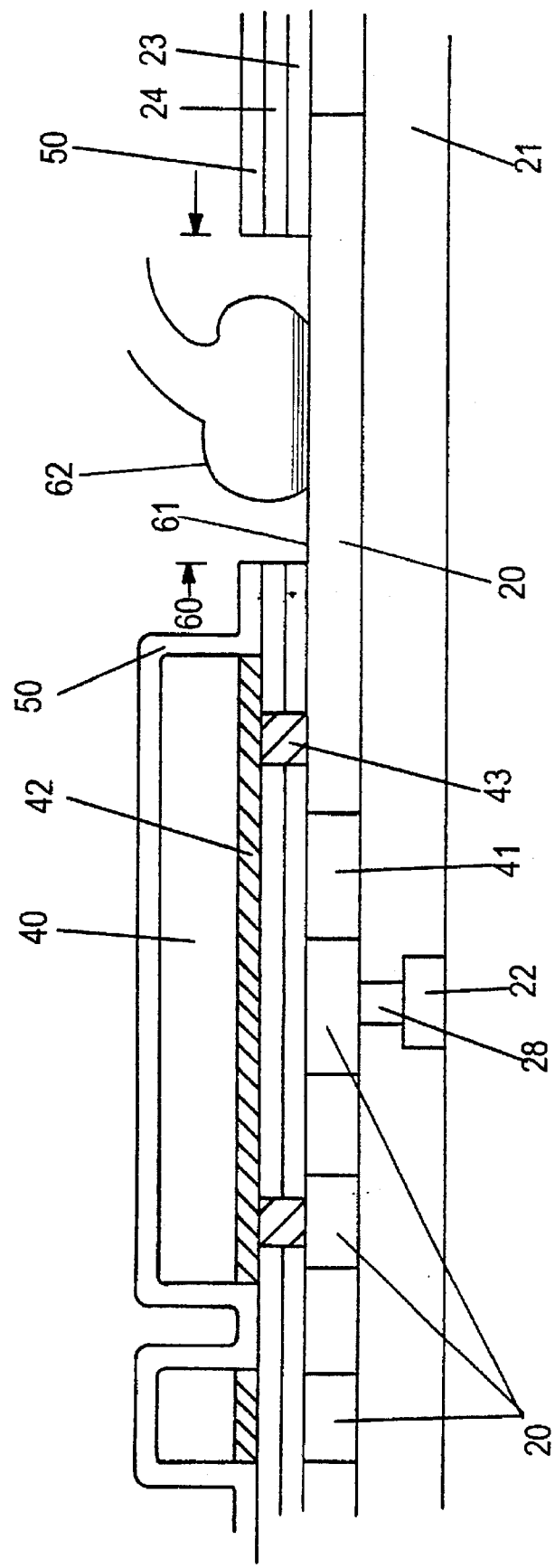
FIG. 6 depicts a preferred aspect of the embodiment depicted in FIG. 5.

FIG. 6 illustrates the further step of forming a wire bonding opening, previously indicated in FIG. 2 by dotted lines 25 defining area 26. The opening is cut by conventional photolithographic and etching techniques. Typically, a wire bonding opening of about 100 mils is formed by etching through additional protective dielectric layer 50, silicon nitride layer 24 and silicon dioxide layer 23, employing conventional etching techniques. Thus, after masking and etching, a bond-pad opening is formed and bonding pad 61 comprised of wire bonding layer 20. Electrically conductive wires 62 are then joined to bonding pad 61 (wire bonding layer 20) to provide an external electrical connection.

Figure 7:
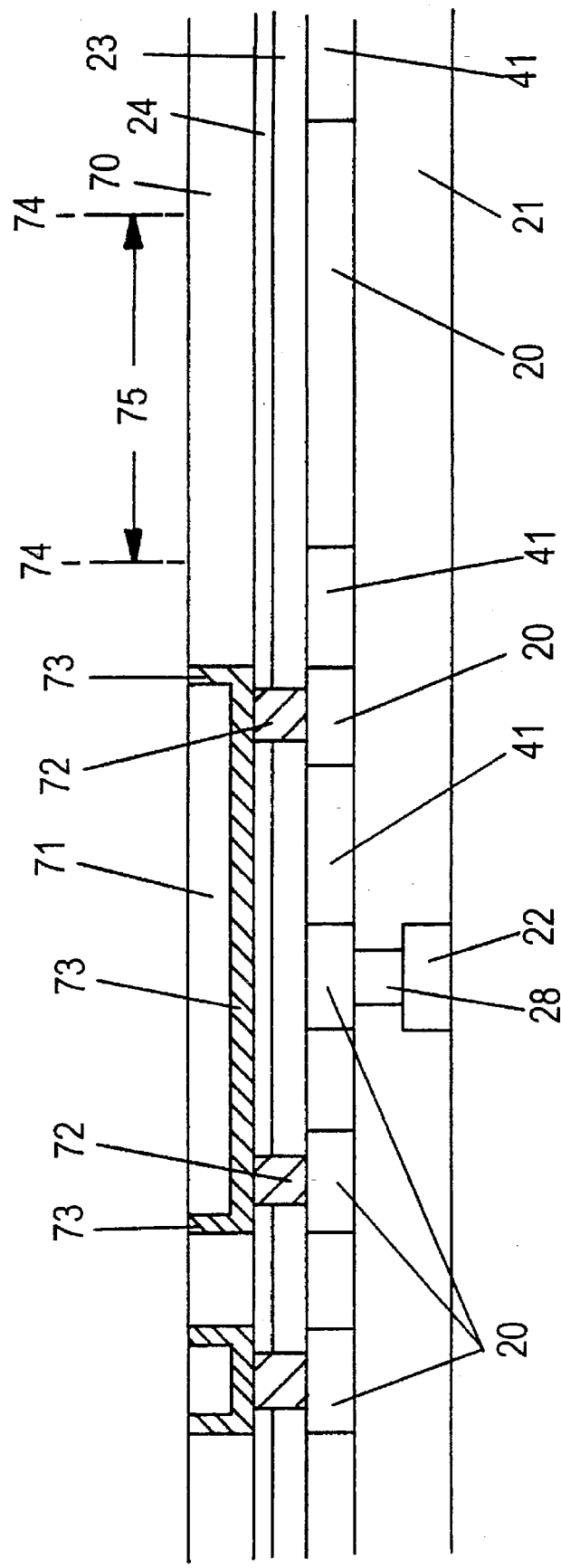
FIG. 7 illustrates an embodiment of the present invention involving a single damascene technique.

The embodiment of the present invention illustrated in FIG. 7 comprises vias providing electrical connection between a conductive interconnection line, preferably of copper or a copper-base alloy, formed above the wire bonding layer, to the wire bonding layer employing a single damascene process. As in the previous figures, similar elements are represented by similar reference numerals. Dielectric layer 70, preferably of silicon dioxide or silicon nitride, is initially deposited and openings formed therein employing a single damascene technique. The openings are filled with via plugs 72, preferably of tungsten, for electrical connection to aluminum or aluminum-base alloy wire bonding layer 20. Conductive barrier layer 73, preferably comprising titanium oxynitride, and copper or copper-base alloy interconnection line 71 are formed over the damascene openings filled with conductive via plugs 72, thereby completing the electrical connection of copper or copper-base alloy interconnect line 71 to aluminum or aluminum-base alloy wire bonding layer 20. Lines 74 define area 75 in which a bonding pad is to be joined to wire bonding layer 20. Dielectric layer 70 can comprise silicon dioxide or various conventional organic dielectric materials such as paralene, polyimide, Dow Chemical "BCB" or Allied Signal "Flare." An optional, but preferable, additional protective dielectric barrier layer can be deposited, similar to layer 50 in FIG. 5.

Figure 8:
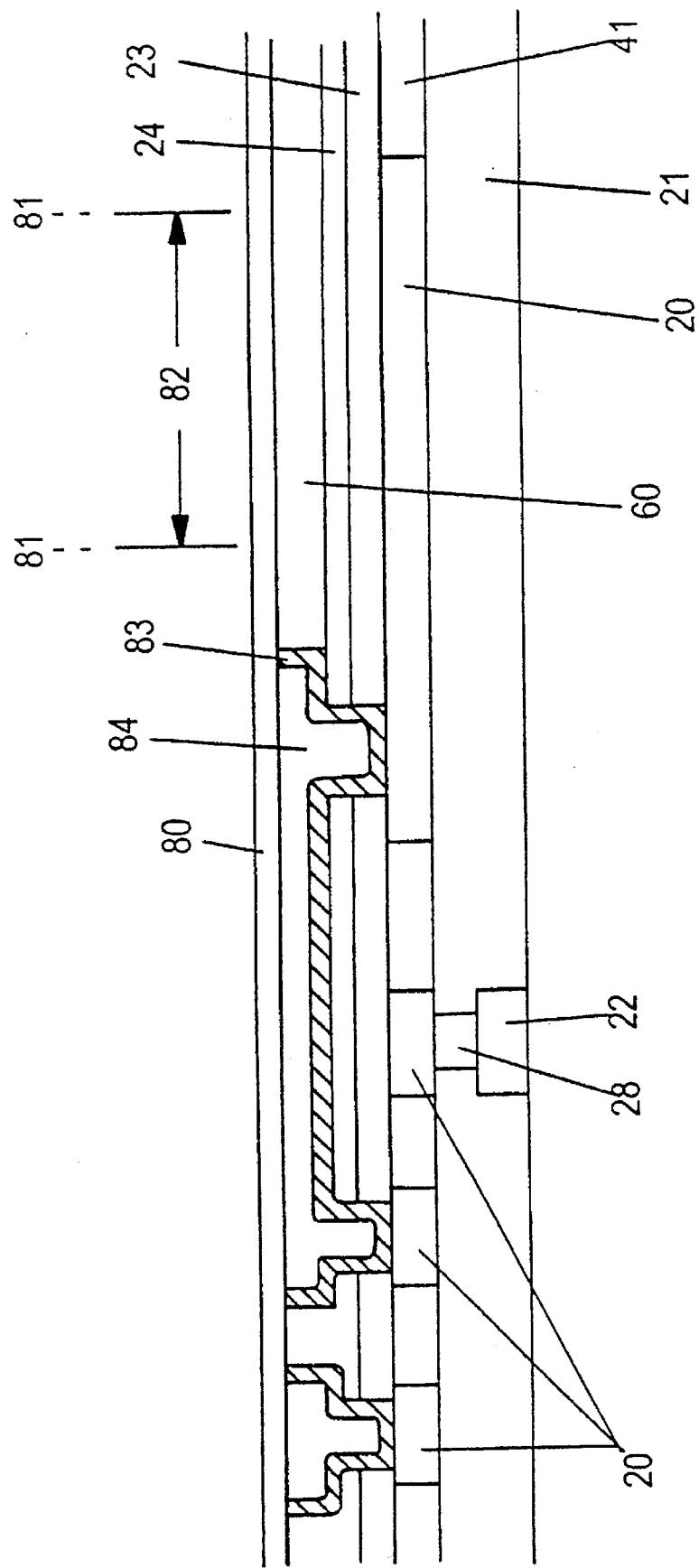
FIG. 8 illustrates an embodiment of the present invention involving a dual damascene technique.

A dual damascene technique can also be employed in accordance with the present invention. The embodiment depicted in FIG. 8 illustrates the use of a dual damascene technique. In this embodiment, the dual damascene structure is provided by conductive barrier layer 83 and copper or copper-base alloy interconnection line 84 vis-à-vis conductive via plugs 72 in the embodiment illustrated in FIG. 7. The preferred additional protective dielectric layer 80, preferably silicon nitride, is provided to completely encase copper in barrier material, thereby preventing the detrimental diffusion of copper atoms. Lines 81 define area 82 in which a bonding pad is to be joined to wire bonding layer 20. Thus, a dual damascene procedure is conducted wherein the via constitutes the first damascene layer and the interconnect constitutes the second damascene layer. Conductive barrier layer 83 is initially deposited and copper or copper-base alloy interconnection line 84 deposited on conductive barrier layer 83. Since the vias can be extremely small, the conductive barrier material can completely fill the via with little or no copper or copper-base alloy in the via itself. This constitutes a design variable and can be optimized in a particular situation.

The illustrations of various embodiments of the present invention depict one conductive interconnection line above the wire bonding layer. However, the present invention also comprises the formation of multiple layers of copper or copper-base alloys, or other conductive materials, sequentially above the wire bonding layer, thereby increasing the flexibility and operational characteristics of the resulting semiconductor device.

In accordance with the present invention, the performance capabilities and characteristics of a semiconductor device are improved by the use of materials having a high conductivity and by the use of conductive interconnection lines above the wire bonding layer. Thus, the present invention provides semiconductor devices with high operating speeds, improved signal-to-noise ratios, improved efficiency, improved reliability, and improved wear characteristics. The semiconductor device of the present invention is manufactured with metal conductive layers having an electrical conductivity greater than that of aluminum and aluminum-base alloys. In addition, one or more conductive interconnection lines are provided above the wire bonding layer, preferably of copper or a copper-base alloy. The disclosed embodiments and concepts of the present invention enjoy utility in any type of semiconductor device wherein interconnection patterns are formed.

Only the preferred embodiments of the present invention and examples of its versatility are shown and described in the present disclosure. It is to be understood that the invention is capable of use in various other combinations and environments and is capable of changes or modifications within the scope of the inventive concept as expressed herein.

I claim:

1. A semiconductor device, comprising:
   a semiconductor substrate;
   a plurality of levels of dielectric layers and aluminum conductive layers formed on the semiconductor substrate, wherein an upper aluminum conductive layer constitutes a wire bonding layer for external connection thereto; and
   a high conductivity interconnection line formed at a level above the aluminum wire bonding layer with a dielectric layer therebetween, wherein the high conductivity interconnection line consists essentially of a conductive metal selected from the group consisting of copper, copper-base alloys, gold, gold-base alloys, silver, silver-base alloys and superconducting materials.

2. The semiconductor device according to claim 1, wherein the metal comprises copper or a copper-base alloy.

3. The semiconductor device according to claim 1, wherein the metal comprises gold or a gold-base alloy.

4. The semiconductor device according to claim 1, wherein the metal comprises silver or a silver-base alloy.

5. The semiconductor device according to claim 1, wherein the metal comprises a superconducting material.

6. The semiconductor device according to claim 2, wherein the high conductivity interconnection line is formed on a dielectric barrier layer comprising a material which is substantially impervious to the diffusion of copper atoms therethrough.

7. The semiconductor device according to claim 6, wherein the substantially impervious dielectric material is silicon nitride or silicon oxynitride.

8. The semiconductor device according to claim 7, wherein the substantially impervious dielectric material is silicon nitride.

9. The semiconductor device according to claim 1, further comprising a via through which the high conductivity interconnection line is in electrical contact with the wire bonding layer and/or a lower conductive layer.

10. The semiconductor device according to claim 9, wherein the high conductivity interconnection line comprises copper or a copper-base alloy.

11. The semiconductor device according to claim 10, wherein the high conductivity interconnection line is in electrical contact with the wire bonding layer and/or a lower conductive layer through a conductive barrier layer comprising material which is substantially impervious to the diffusion of copper atoms therethrough.

12. The semiconductor device according to claim 11, wherein the substantially impervious material is titanium nitride, titanium oxynitride or titanium-tungsten.

13. The semiconductor device according to claim 10, further comprising a protective dielectric layer on the high conductivity interconnection line.

14. The semiconductor device according to claim 13, wherein the protective dielectric layer comprises a material which substantially impervious to the diffusion of copper atoms therethrough.

15. The semiconductor device according to claim 14, wherein the substantially impervious material is silicon nitride or silicon oxynitride.

16. The semiconductor device according to claim 1, comprising an aluminum bonding pad in electrical contact with the aluminum wire bonding layer and having an external electrode connected thereto.

17. The semiconductor device according to claim 1, comprising a plurality of high conductivity interconnection lines formed at a plurality of sequential levels above the aluminum wire bonding layer.

18. A semiconductor device having an integrated circuit on a die, which semiconductor device comprises:
    a semiconductor substrate;
    a dielectric layer formed thereon;
    one or more aluminum interconnect layers; and
    a high conductivity metal interconnection line formed on the dielectric layer above the aluminum interconnect layer(s); wherein the high conductivity metal interconnection line consists essentially of a metal selected from the group consisting of copper, copper-base alloys, gold, gold-base alloys, silver, silver-base alloys and superconducting materials.

19. The semiconductor device according to claim 18, wherein the high conductivity metal interconnection line consists essentially of copper or a copper-base alloy.

20. The semiconductor device according to claim 19, wherein the dielectric layer comprises a material which is substantially impervious to the diffusion of copper atoms therethrough.

21. The semiconductor device according to claim 20, wherein the substantially impervious material is silicon nitride or silicon oxynitride.

22. The semiconductor device according to claim 18, further comprising a via in the dielectric layer through which the high conductivity metal interconnection line is in electrical contact with a lower aluminum conductive layer or active region in the semiconductor substrate.

23. The semiconductor device according to claim 22, wherein the high conductivity metal interconnection line comprises copper or a copper-base alloy.

24. The semiconductor device according to claim 23, wherein the high conductivity metal interconnection line is in electrical contact with a lower conductive layer or active region in the semiconductor substrate through a conductive barrier layer comprising a material which is substantially impervious to the diffusion of copper atoms.

25. The semiconductor device according to claim 24, wherein the substantially impervious material is titanium nitride, titanium oxynitride, or titanium-tungsten.

26. The semiconductor device according to claim 18, further comprising an aluminum wire bonding layer having an external electrical connection; wherein the high conductivity metal interconnection line is positioned at a level above the aluminum wire bonding layer.

* * * * *